United States Patent
Kasumi et al.

(10) Patent No.: US 7,180,575 B2
(45) Date of Patent: Feb. 20, 2007

(54) EXPOSURE APPARATUS AND DEVICE MANUFACTURING METHOD

(75) Inventors: Kazuyuki Kasumi, Utsunomiya (JP); Hirohisa Ota, Kawagoe (JP); Eigo Kawakami, Utsunomiya (JP); Takashi Nakamura, Edogawa (JP); Toshinobu Tokita, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/257,791

(22) Filed: Oct. 24, 2005

(65) Prior Publication Data

US 2006/0087635 A1    Apr. 27, 2006

(30) Foreign Application Priority Data

Oct. 26, 2004    (JP) .............................. 2004-311010

(51) Int. Cl.
  *G03B 27/42*    (2006.01)
  *G03B 27/54*    (2006.01)
(52) U.S. Cl. .......................................... 355/53; 355/67
(58) Field of Classification Search ................. 355/53, 355/67
See application file for complete search history.

(56) References Cited

U.S. PATENT DOCUMENTS

| 5,330,878 | A | 7/1994 | Nelson |
| 5,691,541 | A | 11/1997 | Ceglio et al. |
| 6,285,488 | B1 | 9/2001 | Sandstrom |
| 2002/0001028 | A1* | 1/2002 | Mori et al. ............. 347/228 |
| 2003/0179352 | A1* | 9/2003 | Van Der Mast ........... 355/53 |

FOREIGN PATENT DOCUMENTS

| EP | 1 315 850 A1 | 6/2003 |
| JP | 2002-506233 | 2/2002 |
| JP | 2003-243300 | 8/2003 |

* cited by examiner

*Primary Examiner*—Henry Hung Nguyen
*Assistant Examiner*—Marissa A Ohira
(74) *Attorney, Agent, or Firm*—Morgan & Finnegan, LLP

(57) ABSTRACT

An exposure apparatus includes a projection optical system for projecting a multigradation pattern onto an object, a spatial modulation element that includes plural, two-dimensionally arranged pixels, and forms an optical image by binary control over each pixel, and a superposing optical system for forming the multigradation pattern by superposing the optical images for each row and/or for each column.

9 Claims, 13 Drawing Sheets

PRIOR ART

EXPOSURE APPARATUS AND DEVICE MANUFACTURING METHOD

This application claims a benefit of priority based on Japanese Patent Application No. 2004-311010, filed on Oct. 26, 2004, which is hereby incorporated by reference herein in its entirety as if fully set forth herein.

BACKGROUND OF THE INVENTION

The present invention relates generally to an exposure apparatus, and more particularly to an exposure apparatus and method used to manufacture various devices including semiconductor chips, a display device, a sensing device such as a magnetic head, an image pickup device such as a CCD, and a fine pattern for micromechanics. The present invention is suitable, for example, for a maskless exposure apparatus that utilizes a spatial modulation element, such as a micro-mirror array, and dispenses with a mask as an original.

Due to the demand by the large personal computer ("PC") market, the fine processing of the semiconductor integrated circuits ("ICs") has rapidly developed, and the design rule of 90 nm has been achieved. Many devices are produced as highly versatile and marketable microprocessor units ("MPUs") and memories for use with the PCs. These MPUs and the memories use the same devices even for different PC manufacturers and models, and the same semiconductor devices are manufactured in huge quantities.

The information appliances are expected to be the largest market in the future for the semiconductor devices along with the widespread digital TVs, versatile cellular phones, networks, etc. The information appliances use unique semiconductor devices (or system LSIs) suitable for their manufacturers and models, and require the manufacture of various types of devices. The information appliances are designed and produced based on consumers' demands. Various consumers' demands require the manufacture of various products, and limit the number of units produced per model. Individual demands are so fluid that the products need to be put onto the market at the proper times based on the consumers' demands.

For the conventional semiconductor devices typified by the MPUs and memories, the same model can be produced in large quantities over a long time period of time. On the other hand, for the semiconductor devices (or system LSIs) in the information appliances, various types should be produced in small quantities only for short periods of time and placed in the market at the proper times.

A projection exposure apparatus, which has conventionally been used, projects a circuit pattern of a mask (or a reticle) onto a wafer etc. via a projection optical system and transfers the circuit pattern in a lithography that serves as the important technology for production of the semiconductor devices. For the fine processing and the high integration of the semiconductor devices, the projection exposure apparatus can now transfer a pattern smaller than the exposure wavelength by using, for example, a phase shift mask, etc. The phase shift mask is more complicated and thus more expensive than a conventional binary mask.

If the duplicate device is produced in large quantities, the mask cost per device is reduced. However, when the number of produced system LSIs are low, a mask cost increases, which makes the device and mask expensive, such as the phase shift mask. The information appliances are subject to keen price competition similar to conventional home electric appliances, and preferably avoid use of expensive semiconductor devices.

Accordingly, use of a direct imaging type of exposure apparatus (referred to as a "maskless exposure apparatus" hereinafter) to produce the system LSIs attracts attention. The maskless exposure apparatus uses no mask, and can start producing the devices without producing a mask once a device circuit design is determined. The maskless exposure apparatus eliminates the mask cost, and reduces the device producing time period.

For example, a maskless exposure apparatus that uses a similar light source to that of a conventional exposure apparatus is disclosed in U.S. Pat. No. 5,330,878. This maskless exposure apparatus arranges, as shown in FIG. 13, a micro-mirror array or spatial modulation element 1010 that includes many micro mirrors in place corresponding to a mask in the conventional exposure apparatus or between an illumination apparatus 1020 and a projection optical system 1030. The micro-mirror array 1010 generates a circuit pattern and dispenses with a mask. More specifically, the micro-mirror array 1010 generates a circuit pattern by controlling driving of thousands of micro mirrors each having a size of about 10 μm (and by controlling the light reflections through each micro mirror's inclination). The projection optical system 1030 projects and transfers a reduced size of the circuit pattern onto the wafer 1040. Here, FIG. 13 is a schematic sectional view of a structure of the conventional maskless exposure apparatus.

When the maskless exposure apparatus uses, as one pixel, each micro mirror in the micro-mirror array to form a pattern, and binary-controls its darkness and brightness, a pattern forming position is determined by the arrangement of the micro mirrors. For example, when the mirrors are arranged at a pitch of 10 μm and projected at a reduction of $\frac{1}{100}$, the projected pattern forming position has a pitch of 100 nm. On the other hand, the current system LSI's minimum critical dimension ("CD") is smaller than 100 nm, and the arrangement position has a pitch or grid of about 1 nm.

The micro-mirror array can mount about ten million micro mirrors each having a size of 10 μm at most. In the micro-mirror array that has ten million micro mirrors by arranging 2,500 micro mirrors longitudinally and 4,000 micro mirrors laterally, where each micro mirror has a size of 10 μm, a $\frac{1}{10,000}$ reduction optical system should be used to project a pattern for a grid size of 1 nm. Since the entire micro-mirror array has a size of 25 mm×40 mm, the projected pattern size or angle of view is merely 2.5 μm×4 μm. The $\frac{1}{10,000}$ reduction optical system is less feasible, and it takes an enormous time to connect patterns on the overall surface of a semiconductor wafer having a diameter of 300 mm for mass production.

One proposed technology to realize a virtual grid smaller than the mirror or pixel size used for actual patterning is the gray scale that varies the intensity of each pixel (or integral intensity) and forms a pattern image between pixels in the middle of grid.

The gray scale method is disclosed in International Application, Domestic Publication No. 2002-506233, U.S. Pat. No. 5,691,541, and Japanese Patent Application, Publication No. 2003-243300. International Application, Domestic Publication No. 2002-506233 proposes a method that slightly changes a reflecting angle of each micro mirror in the micro mirror array and varies the reflected light intensity. U.S. Pat. No. 5,691,541 proposes a method that divides the exposure into plural times, controls each pixel for each exposure and adjusts the integral exposure dose of a pixel. Japanese Patent Application, Publication No. 2003-243300 proposes a method that synthesizes and transfers images of plural spatial modulation elements that have adjusted different intensities.

However, the gray scale technology disclosed in International Application, Domestic Publication No. 2002-506233 needs an analog-to-digital conversion for each of a million of micro mirrors, and calibrates each micro mirror, causing a very complex and large system.

The gray scale technology disclosed in U.S. Pat. No. 5,691,541 requires multiple exposures for the improved intensity resolution, remarkably lowering the throughput.

The gray scale technology disclosed in Japanese Patent Application, Publication No. 2003-243300 complicates an optical system that synthesizes images formed by the distant spatial modulation elements, and has difficulties in assembly and adjustment.

The maskless exposure apparatus that uses the spatial modulation element should achieve a high throughput. For this purpose, it is conceivable to increase the number of pixels in the spatial modulation element and to extend an exposable area per unit time by enlarging an area for a single exposure and by shortening an exposure period. Any method requires a speed moving from one shot to another shot, which speed is generally referred to as a wafer stage speed. However, the current wafer stage speed has already reached the upper limit, and the improved throughput using the improved wafer stage speed cannot be expected.

BRIEF SUMMARY OF THE INVENTION

The present invention is directed to an exposure apparatus and a device manufacturing method, which can facilitate the gray scale with a simple structure and provide a high throughput.

An exposure apparatus according to one aspect of the present invention includes a projection optical system for projecting a multigradation pattern onto an object, a spatial modulation element that includes plural, two-dimensionally arranged pixels, and forms an optical image by binary control over each pixel, and a superposing optical system for forming the multigradation pattern by superposing the optical images for each row and/or for each column.

An exposure apparatus according to another aspect of the present invention includes a projection optical system for projecting a pattern onto an object, a spatial modulation element that includes plural pixels, and forms the pattern by binary control over each pixel, a mirror for scanning the pattern on the object, and a wafer stage for scanning the object.

A device manufacturing method according to still another aspect of the present invention includes the steps of exposing an object using the above exposure apparatus, and developing the object that has been exposed.

Other objects and further features of the present invention will become readily apparent from the following description of the preferred embodiments with reference to accompanying drawings.

DETAILED DESCRIPTION OF THE PREFERRED EMBODIMENTS

Figure 1:
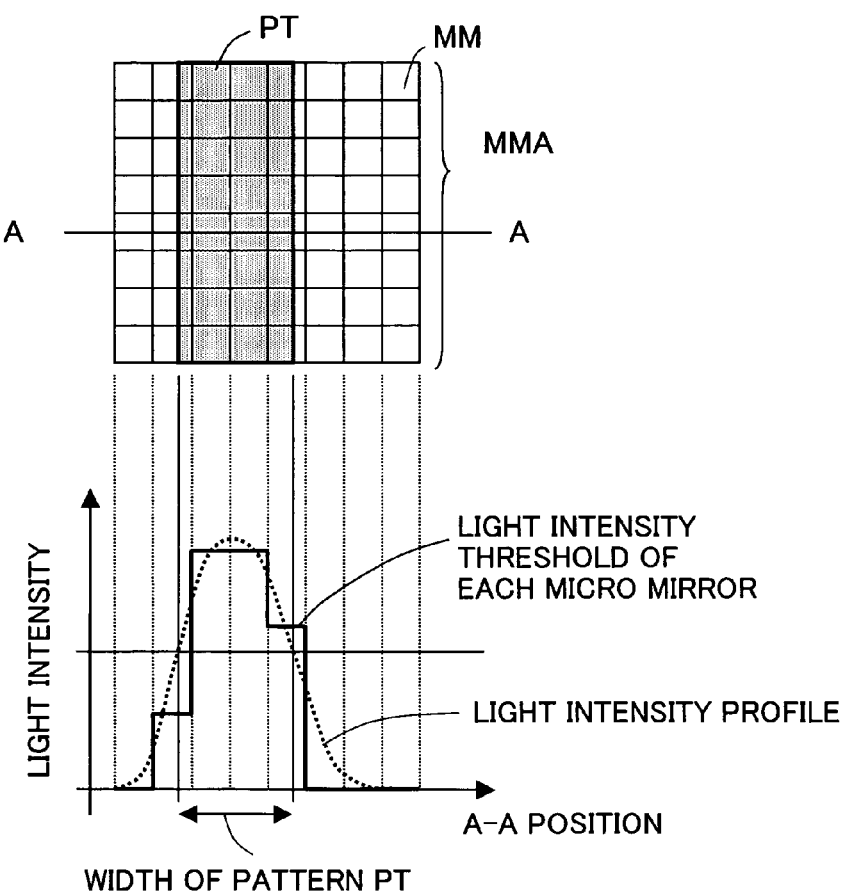
FIG. 1A is a plane view of a micro-mirror array ("MMA").
FIG. 1B is a light intensity distribution of the MMA shown in FIG. 1A.

Referring now to the accompanying drawings, a description will be given of an exposure apparatus according to one aspect of the present invention. Like elements in each figure are designated by the same reference numerals, and a description thereof will be omitted.

A description will now be given of the gray scale for better understanding of the inventive exposure apparatus. FIG. 1A is a plane view of a micro-mirror array ("MAA") that has sixty-four micro mirrors ("MM") or pixels, i.e., eight long by eight broad. A rectangular area PT denotes a pattern to be formed. As shown in FIG. 1A, an outline of the pattern PT does not accord with outlines of the MMs.

FIG. 1B is a light intensity distribution of the MMA shown in FIG. 1A, where an ordinate axis denotes the light intensity and an abscissa axis denotes a MMA's position. The solid line denotes the light intensity of each MM, and a broken line denotes a projected intensity profile.

The original intensity distribution that is formed by the MMA as indicated by a solid line and is projected onto the image surface via a projection optical system turns to the intensity profile indicated by a broken line due to the influence of the diffractions. The light intensity above a predetermined threshold to expose the resist contributes a formation of a pattern PT having a predetermined thickness. The width of the exposed pattern PT (or its end position) can be variable by changing the light intensity of the MM on the boundary. The gray scale is effective in exposing a size smaller than the resolution limit of the projection optical system. A method that forms a light intensity distribution of each MM includes a time modulation and an intensity modulation. The time modulation is a method that changes the time during which each MM emits and forms the integral intensity distribution. The intensity modulation is a method that changes the intensity of each MM.

Figure 2:
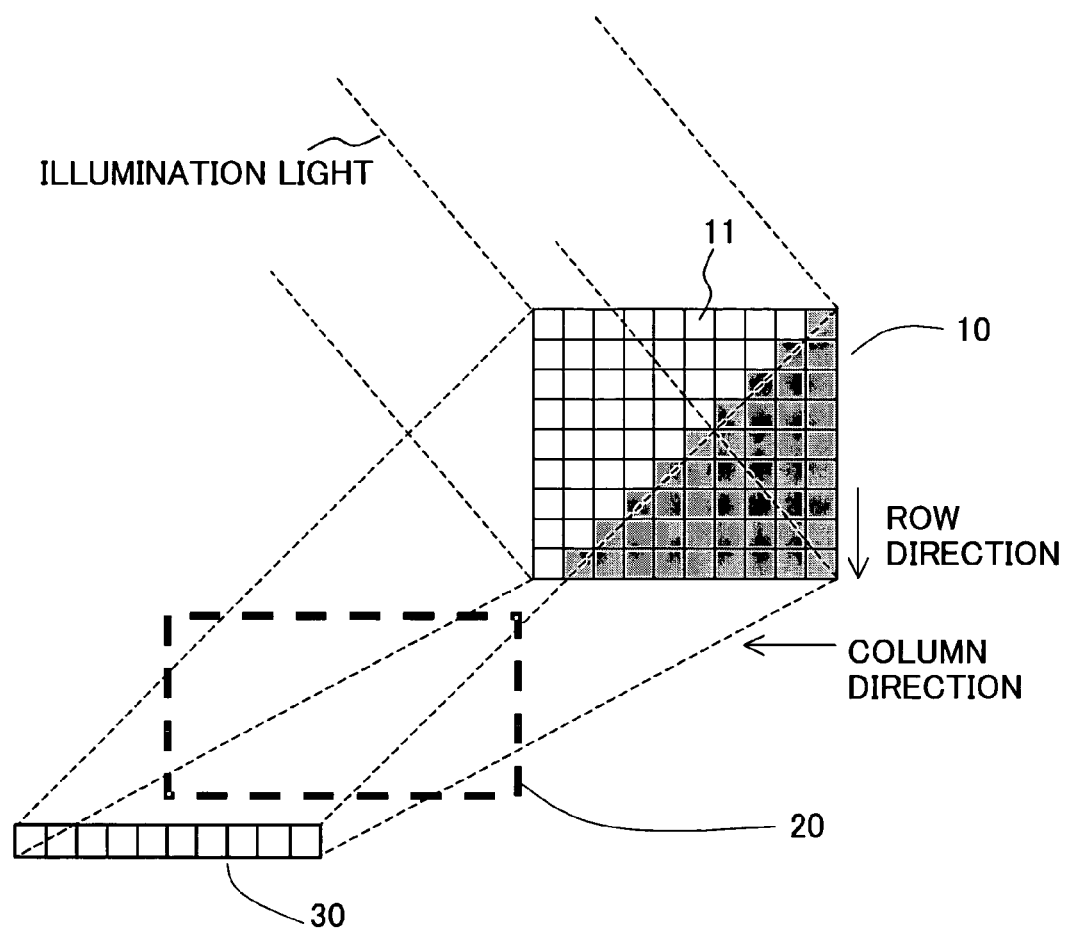
FIG. 2 is a view for explaining a basic principle of a gray scale according to the present invention.

FIG. 2 is a view for explaining a basic principle to realize the inventive gray scale. In FIG. 2, 10 denotes a MMA as the spatial modulation element. 11 denotes a MM in one pixel in the MMA 10, and plural MMs are arranged two-dimensionally (longitudinally and laterally). 20 denotes a superposing optical system that superposes pixels of the pattern (optical image) formed by the MMA 10 in the row direction. While the following embodiment superposes pixels in the row direction, this can be expanded to a superposition of pixels in the column direction. Specifically, the superposing optical system 20 includes a wedge prism array and a cylindrical lens array in which cylindrical lenses are arranged by the number of pixels 11 in the column direction of the MMA 11. 30 denotes a multigradation pattern image, which is a linear image rather than a two-dimensional image of this embodiment.

Each pixel 11 in the MMA 10 is binary-controlled or on/off-controlled so that the reflected light can or cannot reach the image surface. The MMA 10 has nine pixels 11 in the row direction in this embodiment, and the on/off control over each pixel 11 provides changes of the light intensity in ten stages from 0 to 9. FIG. 2 shows an example that decreases the intensity by one stage from the strongest intensity in order from the left side of the MMA 10. When the superposing optical system 20 superposes the optical images formed by plural pixels 11 (or the lights from plural pixels 11) for each row direction, the multigradation pattern image 30 is formed as shown in FIG. 2. Thus, the gray scale can be realized by the simple on/off or binary control over the plural pixels 11.

Since each pixel 11 in the MMA 10 has the same reflectance in FIG. 2, the intensity similarly changes when any one of nine pixels 11 in the row direction turns on. In other words, the light intensity is determined by the number of turned-on pixels 11 in the row direction. For example, when one pixel 11 turns on, the pattern image 30 maintains irrespective of whether it is the first or third pixel.

Figure 3:
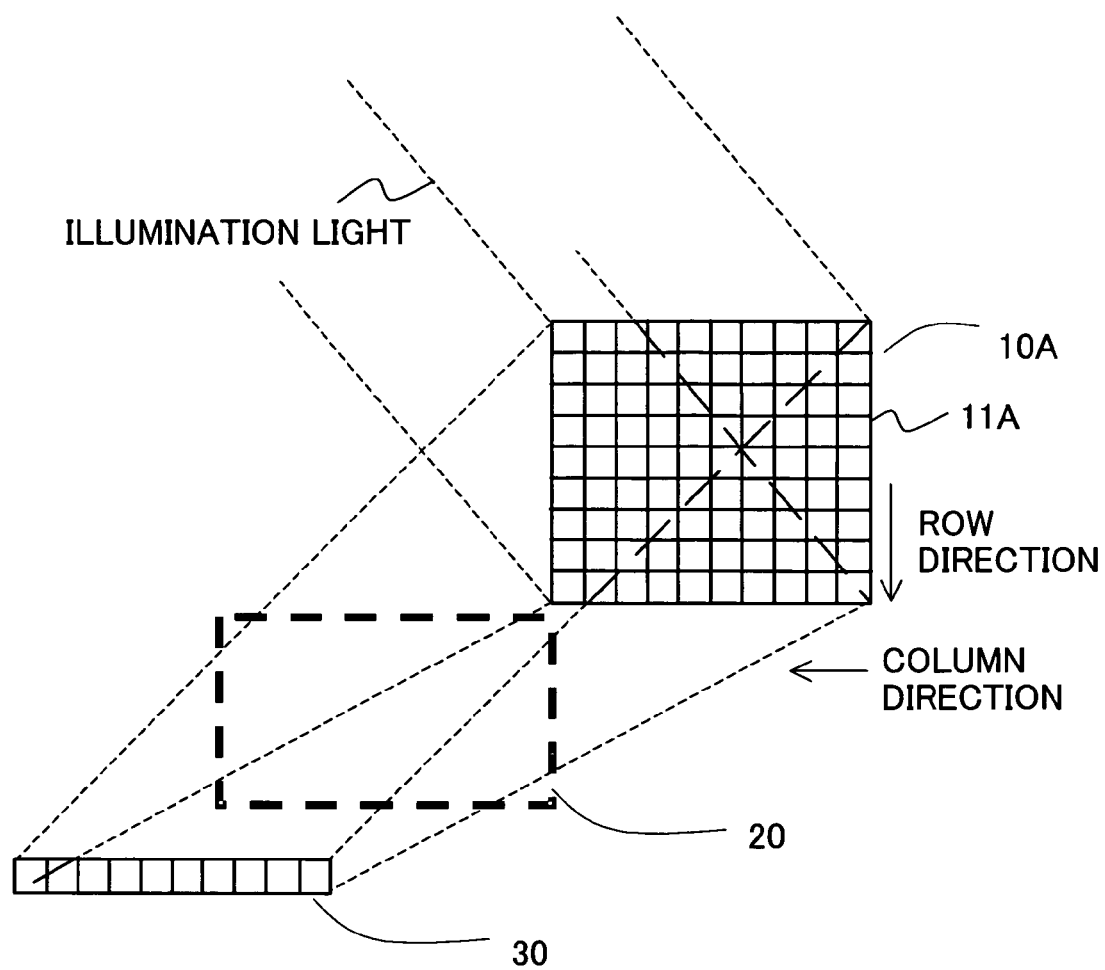
FIG. 3 is a view for explaining a basic principle for realizing another gray scale according to the present invention.

FIG. 3 is a view for explaining the basic principle of another gray scale of the present invention. In FIG. 3, 10A denotes a MMA as the spatial modulation element. 20 denotes a superposing optical system. 30 denotes a pattern image.

A difference between the gray scale in FIG. 2 and the gray scale in FIG. 3 is the MMA 10A. The pixel 11 in the MMA 10 has the same reflectance, whereas the pixels 11A in the MMA 10A have different reflectance in the respective column directions in FIG. 4. Here, FIG. 4 is a view showing the reflectances of the pixels 11A in the MMA 10A.

Figure 4:
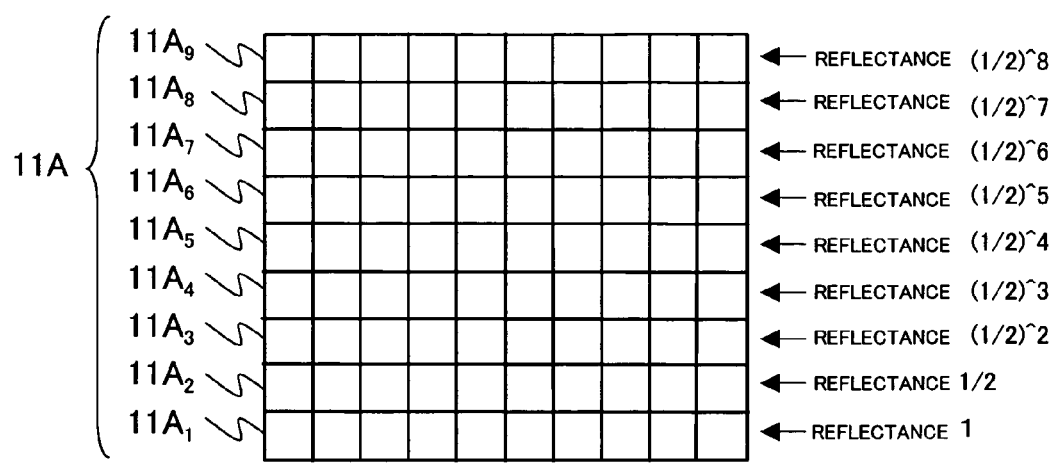
FIG. 4 is a view showing a reflectance arrangement of pixels in the MMA shown in FIG. 3.

Referring to FIG. 4, the pixels 11A in the MMA 10A include, in order from the bottom column to the top column, pixels $11A_1$ having the reflectance of 1, pixels $11A_2$ having the reflectance of ½, pixels $11A_3$ having the reflectance of $(½)^2$, pixels $11A_4$ having the reflectance of $(½)^3$, pixels $11A_5$ having the reflectance of $(½)^4$, pixels $11A_6$ having the reflectance of $(½)^5$, pixels $11A_7$ having the reflectance of $(½)^6$, pixels $11A_8$ having the reflectance of $(½)^7$, and pixels $11A_9$ having the reflectance of $(½)^8$.

The MMA 10A that has pixels 11A having different reflectances by power for each column express a pattern image 30 having $2^9=512$ gradations by superposing nine pixels 11A in the row direction through simple binary or on/off control over the pixels 11A.

A superposition of the nine pixels 11A in the row direction in the MMA 10A forms one pixel of the pattern image 30. Once the gradation is set from the blocking state having the intensity of 0 to the strongest intensity level of 512, the on/off arrangement of these pixels 11A is uniquely determined. While this embodiment varies the reflectances of the pixels 11A in the MMA 10A, a combination of binary control over the conventional MMA (spatial modulation element) and a filter arranged in the subsequent stage can provide similar effects as long as the filter is adjusted to have a transmittance that differs for each column direction of the pixel in the MMA.

Figure 5:
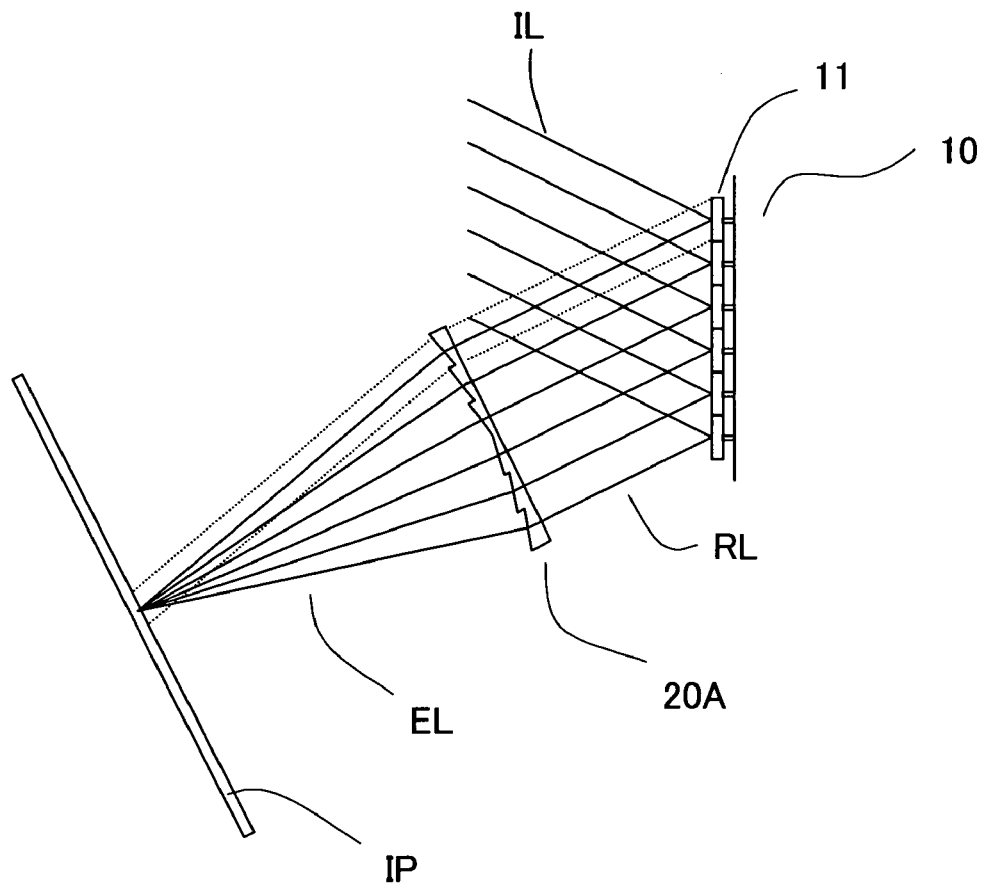
FIG. 5 is a view of a prism array as one example of a superposing optical system shown in FIGS. 2 and 3.

A description will now be given of the superposing optical system 20 that superposes pixels 11 or 11A in the MMA 10 or 10A in the row direction. FIG. 5 is a view showing the prism array 20A as one example of the superposing optical system 20. FIG. 5 laterally shows the prism array 20A for better understanding of its shape.

Referring to FIG. 5, the illumination light IL is incident upon the MMA 10. The MMA 10 binary-controls whether or not the reflected light RL is incident upon the prism array 20A by controlling an angle of each MM 11. The reflected light RL is incident upon the prism array 20A, angles of exited lights EL from the prism array 20A are changed for each column of the array, and these lights EL are superposed on the image surface IP.

Figure 6:
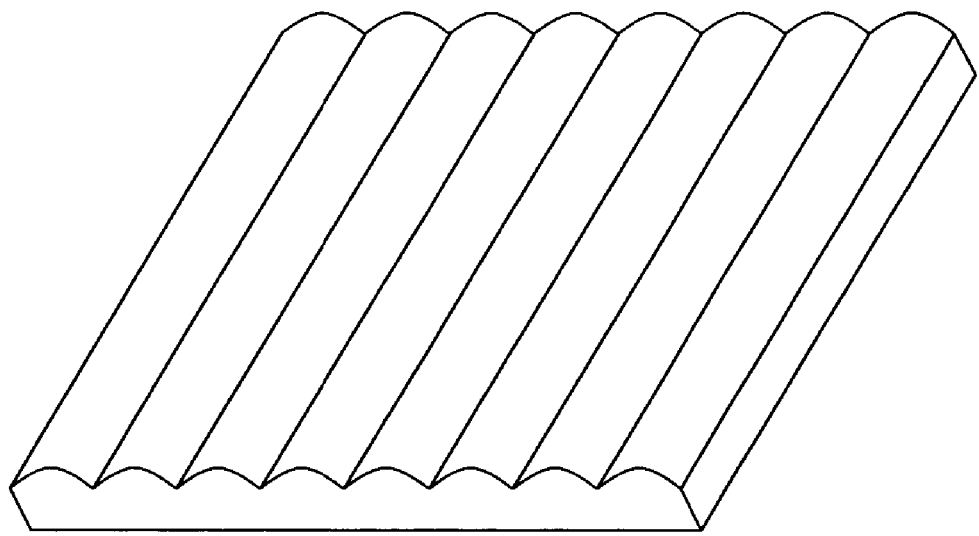
FIG. 6 is a view of a cylindrical array as one example of the superposing optical system shown in FIGS. 2 and 3.

The prism array 20A has a shape that combines plural thin prisms corresponding to the number of plural pixels 11 (e.g., six pixels in FIG. 4) to be superposed in the row direction in the MMA 10. The prism array 20A has different angles for each column of pixels 11 in the MMA 10, and the lights in the row direction condense upon one point. While this embodiment discusses the prism array 20A as the superposing optical system, another superposing optical system 20 provides similar effects, such as a cylindrical lens array 20B shown in FIG. 6 and a mirror array having different angles for each column of pixels 11 in the MMA 10. Here, FIG. 6 is a view showing the cylindrical lens array 20B as one example of the superposing optical system 20.

The above embodiment forms one column of a pattern image 30 (that is a linear bright and dark image) by superposing into one plural pixels 11 in the row direction in the MMA 10. However, one column is selected for better understanding of the present invention, and the pattern image 30 is formed by superposing plural pixels 11 of plural columns.

Figure 7:
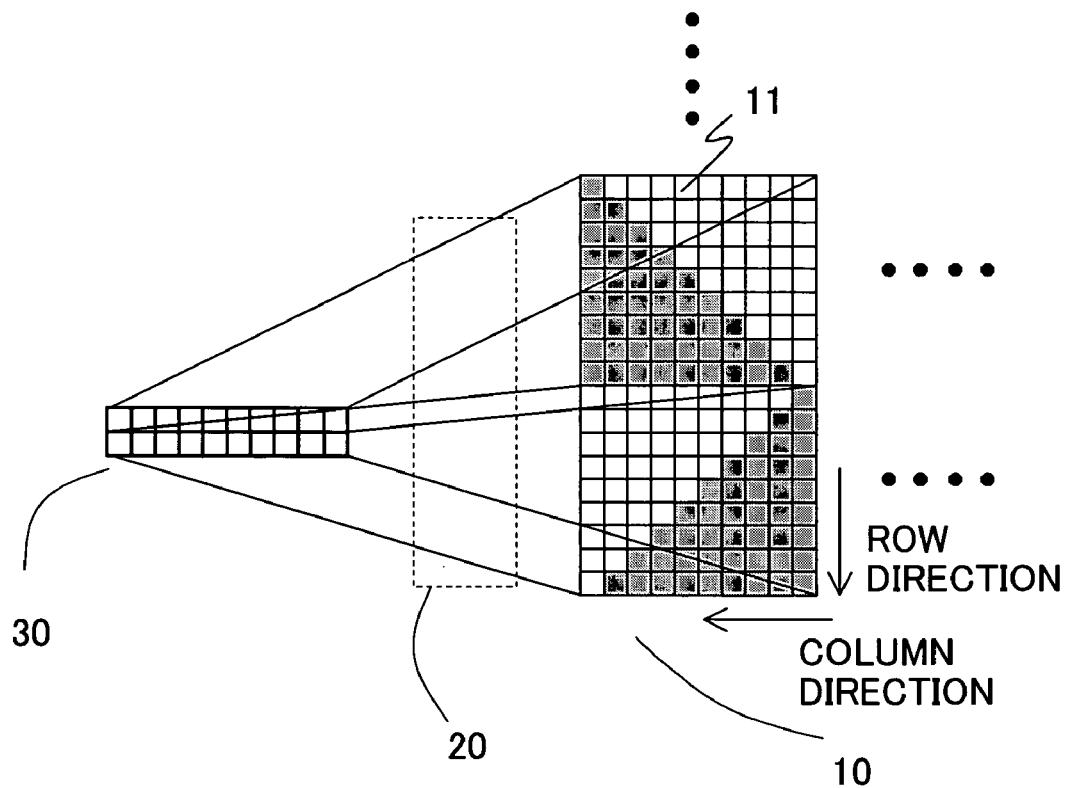
FIG. 7 is a view for explaining a formation of a two-dimensional pattern image using the MMA and the superposing optical system.

For example, as shown in FIG. 7, the pattern image 30 for one column is formed by using nine pixels 11 in the row direction as one set in the spatial modulation element, such as the MMA 10. The superposing optical system 20, such as a prism lens array 20A and a cylindrical lens array 20B, superposes the pixels 11 every nine pixels 11 in the row direction in the MMA 10. Assume that the actual MMA 10 has 900 pixels 11 long by 2,000 pixels 11 broad. The pattern image 30 has 100 pixels long by 2,000 pixels broad. When all the lights from the pixels 11 have the same intensity or each pixel 11 in the MMA 10 has the same reflectance, the gray scale pattern image 30 of 10 stages can be formed. When the spatial modulation element includes pixels having the light intensity distributions that change in the row direction by the power of (½), the 512-gradation gray scale can be expressed. Here, FIG. 7 is a view for explaining how the MMA 10 and the superposing optical system 20 form the two-dimensional pattern image 30.

As shown in FIG. 5, in superposing the pixels 11 in the row direction, the pixels in different rows in the MMA 10 have different incident angles upon the image surface IP. Since the optical axis shifts, the defocus causes an image offset in which spots having different intensities are projected at shifted positions, lowering the gray scale effect.

Accordingly, when the pixels 11 in the MMA 10 have the same light intensity as shown in FIG. 2, an arrangement of pixels 11a and 11b to be turned on and off may be made symmetrical with respect to the center axis on the MMA 10. Alternatively, as shown in FIG. 8B, the pixels 11a and 11b to be turned on and off may be made approximately symmetrical with respect to a horizontal axis on the MMA 10. In projecting a single pattern image, the exposure is divided into two. As shown in FIG. 8C, the pixels 11a and 11b to be turned on and off may be made symmetrical between two exposures on the MMA 10.

Figure 8A:
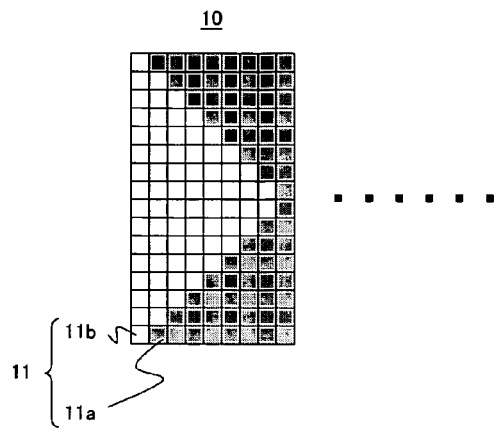
FIGS. 8A–8D are views each showing illustrative binary control over the pixels in the MMA.
Figure 8B:
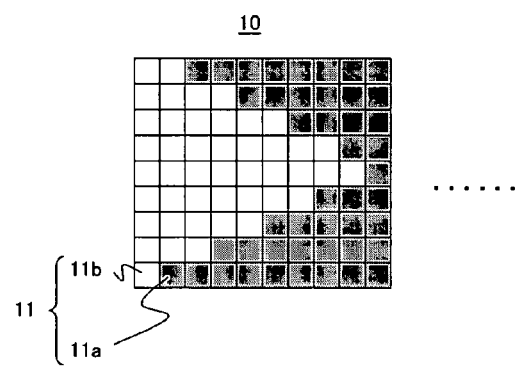
Figure 8C:
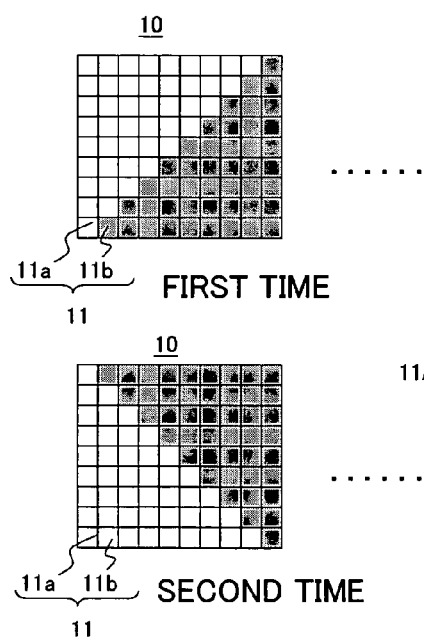
Figure 8D:
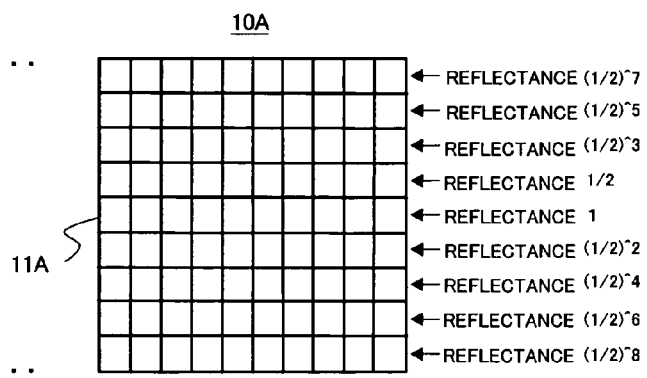

Similarly, FIGS. 8A to 8C may be applied to the MMA 10A that includes the pixels 11A having the light intensities that are different by power as shown in FIG. 3. That is, the pixels 11A to be turned on and off (or the intensities of the pixels 11) may be made approximately symmetrical with respect to a horizontal line on the MMA 10A. As shown in FIG. 8D, the MMA 10A can exhibit similar effect to a case where the pixels have the reflectances symmetrical with respect to a horizontal line, when the MMA 10A include the pixels 11A having the reflectance of 1 in the center row, and further include, in order from the center pixels 11A to the end, the pixels 11A, in the pair of columns at both sides of the center column, which have reflectances that change sequentially by the power of (½).

Figure 9:
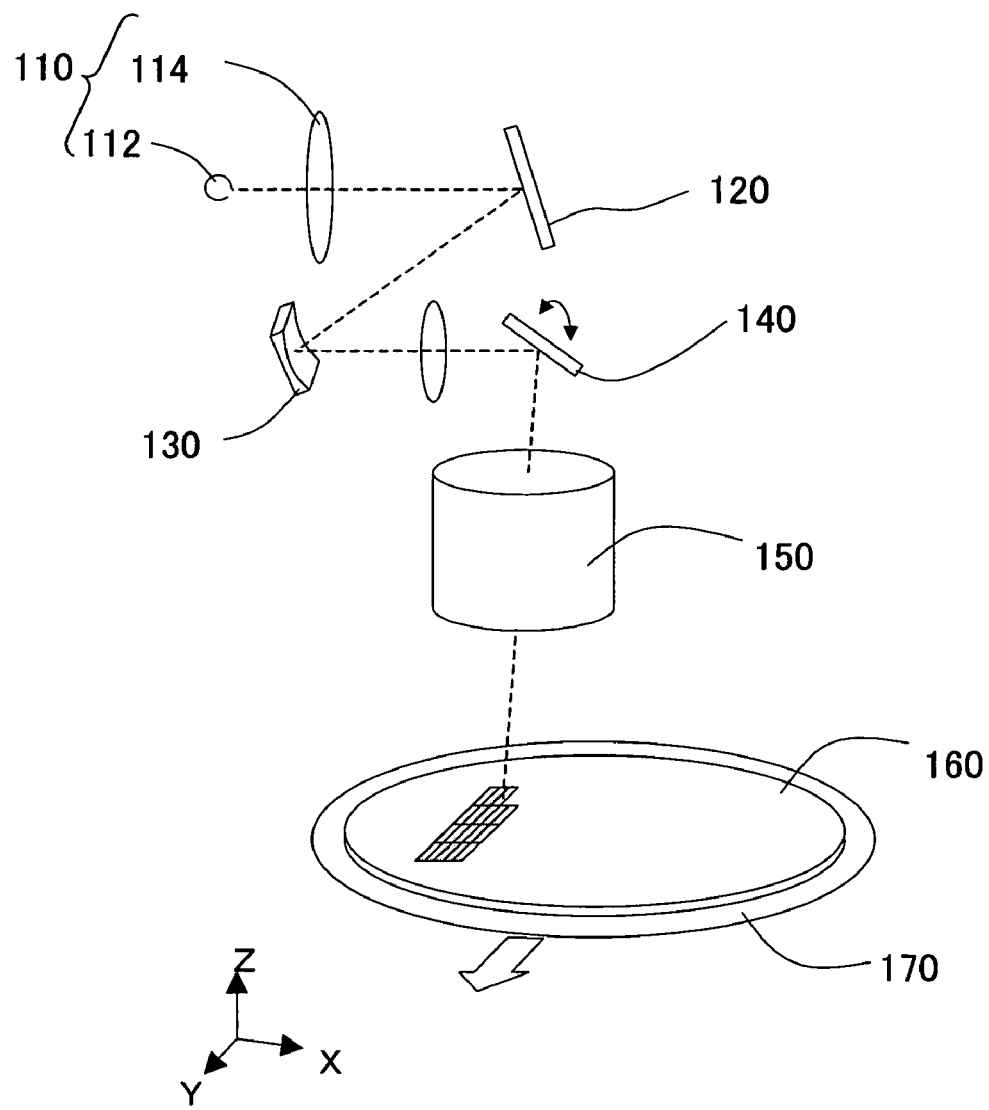
FIG. 9 is a schematic perspective view showing a structure of an exposure apparatus according to one aspect of the present invention.

Referring now to FIG. 9, a description will be given of an exposure apparatus 100 that applies a basic principle of the above inventive gray scale. FIG. 9 is a schematic perspective view showing a structure of the exposure apparatus 100 according to one aspect of the present invention.

The exposure apparatus 100 is a maskless type projection exposure apparatus that exposes a circuit pattern generated by a MMA 120 as a spatial modulation element, onto an object 160. The exposure apparatus 100 arranges a MMA 120 at a position corresponding to a mask position in an exposure apparatus that uses the mask, and forms a circuit pattern by selecting reflection or shielding by controlling an inclination of each MM. Such an exposure apparatus is suitable for a submicron or quarter-micron lithography process, for example, for the system LSIs.

The exposure apparatus 100 includes, as shown in FIG. 9, an illumination apparatus 110, the MMA 120, a superposing optical system 130, a vibrating mirror 140, a projection optical system 150, a wafer stage 170 mounted with the object 160.

The illumination apparatus 110 illuminates the MMA 120 that generates a circuit pattern to be transferred, and includes a light source section 112 and an illumination optical system 114.

The light source section 112 uses, for example, a light source such as an ArF excimer laser with a wavelength of approximately 193 nm and a KrF excimer laser with a wavelength of approximately 248 nm. However, the laser type is not limited to excimer lasers and, for example, an $F_2$ laser with a wavelength of approximately 157 nm and an extreme ultraviolet ("EUV") light having a wavelength of 20 nm or smaller may be used. Similarly, the number of laser units is not limited. For example, speckles caused by the coherence remarkably reduce when two independently operating solid lasers are used. An optical system (not shown) for reducing speckles may swing linearly or rotationally on the optical path. A light source applicable for the light source section 12 is not limited to a laser, and may use one or more lamps such as a mercury lamp and a xenon lamp.

The illumination optical system 114 is an optical system that introduces illumination light emitted from the light source section 112 to the MMA 120, and includes a lens, a mirror, an optical integrator, a stop and the like, for example, a condenser lens, a fly-eye lens, an aperture stop, a condenser lens, a slit, and an imaging optical system in this order. The illumination optical system 114 can use any light regardless of whether it is axial or non-axial light. The light integrator may include a fly-eye lens or an integrator formed by stacking two sets of cylindrical lens array plates (or lenticular lenses), and can be replaced with an optical rod or a diffractive optics.

The MMA 120 is a spatial modulation element that has plural MMs, forms brightness and darkness by controlling an angle of each MM, and generates a pattern. The MMA 120 may apply any of the above embodiments, such as the MMAs 10 and 10A, and a detailed description thereof will be omitted.

The superposing optical system 130 is an optical system that superposes the reflected lights from pixels or MMs in the column direction in the MMA 120, every 10 rows. The superposing optical system 130 may apply any of the above embodiments, such as the superposing optical system 20 (prism array 20A and cylindrical lens array 20B), and a detailed description thereof will be omitted.

The vibrating mirror 140 serves to scan on the object 160 the multigradation pattern (optical image) that is formed by the MMA 120 and the superposing optical system 130. The vibrating mirror 140 may have a variable vibrating shaft so as to make variable the scan direction of the multigradation pattern on the object 160.

The projection optical system 150 reduces the multigradation pattern generated by the MMA 120 and superposing optical system 130, and images the pattern onto a surface of the object 160. The projection optical system 150 includes, for example, an arcsine optical system and a reduction optical system. The arcsine optical system enables the reflecting angle of the vibrating mirror 140 to displace like a sine wave with time and to move at a regular speed in the X direction in FIG. 9. The reduction optical system reduces the multigradation pattern and projects the pattern onto the object 160.

The object 160 of this embodiment is a wafer, and a photoresist (or photosensitive material) is applied onto it. Another embodiment replaces the object 160 with a liquid crystal substrate and another object to be exposed.

The wafer stage 170 supports the object 160 via a wafer chuck (not shown), and is connected to a moving mechanism (not shown). The moving mechanism (not shown) uses, for example, a linear motor to move the object 160 in XYZ-axes directions and rotating directions around each axis. The wafer stage 170 moves the object 160 in the X-axis direction for exposure to the entire surface.

In exposure, the scan speed of the object 160 driven by the wafer stage 170 and the scan speed of the multigradation pattern driven by the vibrating mirror 140 are controlled in synchronization with (the emitting period of) the light emitted from the light source section 112. The pattern is transferred onto the object 160 in place.

Figure 10A:
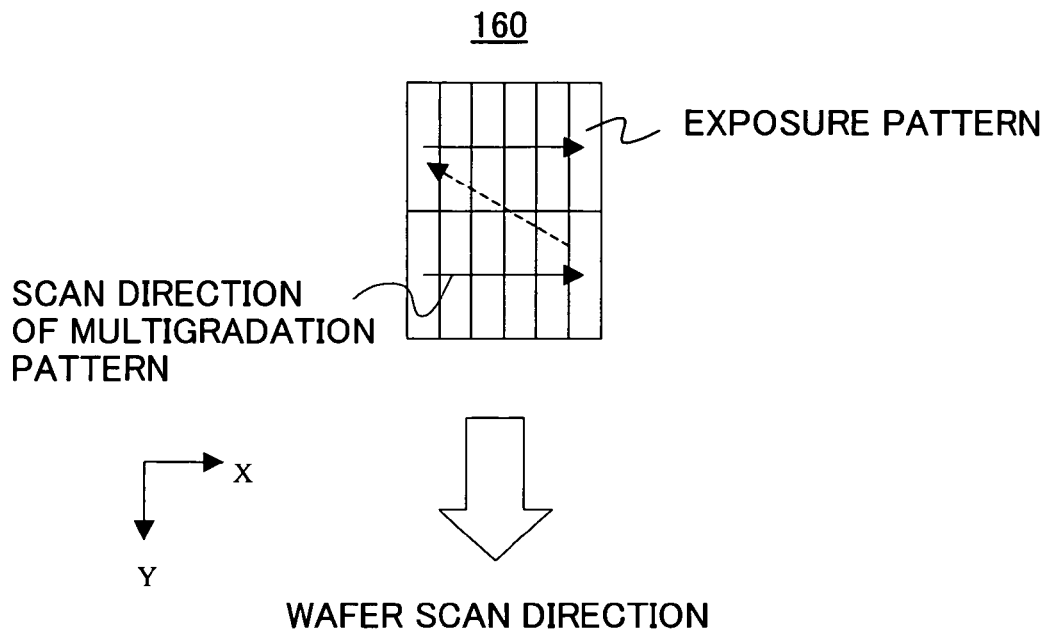
FIGS. 10A–10B are views for explaining a relationship between a scan direction of a multigradation pattern driven by a vibrating mirror shown in FIG. 9 and a scan direction of the object driven by a wafer stage.
Figure 10B:
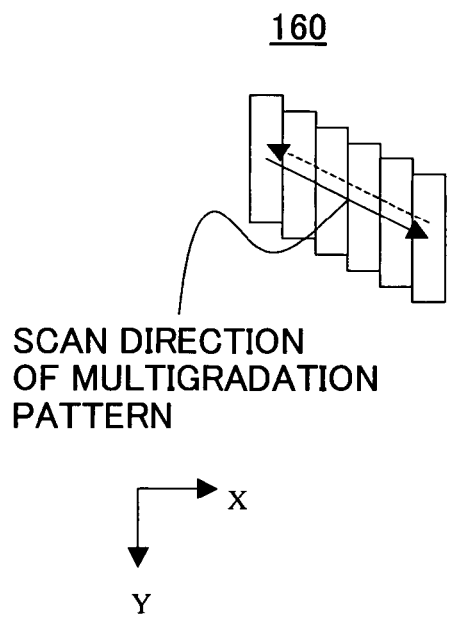

Referring to FIGS. 10A and 10B, a description will be given of a relationship between the scan direction of the multigradation or exposure pattern driven by the vibrating mirror 130 and the scan direction of the object 160 driven by the wafer stage 170. FIG. 10A is a view showing a transfer procedure of the exposure pattern onto the object 160. Referring to FIG. 10A, the object 160 is sequentially exposed in the X-axis direction; it appears that after exposure of one row ends, the exposure to the next row starts. However, actually, the object 160 is continuously moved, and the exposure pattern is exposed in a direction angled to the X-axis as shown in FIG. 10B when the object 160 is viewed from the apparatus. The angle of the scan direction is determined by the light emitting period of the light source 112 and the speed of the wafer stage 170. When an angle between the scan direction of the exposure pattern and the scan direction of the object 160 driven by the wafer stage 160 is set to a right angle, the wafer stage 170 does not move continuously but steps whenever the exposure pattern of one row is scanned.

According to the exposure apparatus 100, the superposing optical system 130 provides the gray scale through the binary control over the MMs in the MMA 120. Therefore, the exposure apparatus 100 is a simple, reliable, less expensive and high-performance maskless exposure apparatus. The exposure apparatus 100 uses the vibrating mirror 140 and scans the optical image formed by the MMA 120 and the superposing optical system 130. The exposure apparatus 100 provides a higher throughput than scanning the optical image only by using the wafer stage, and manufactures devices, such as a system LSI, with good economical efficiency.

Figure 11:
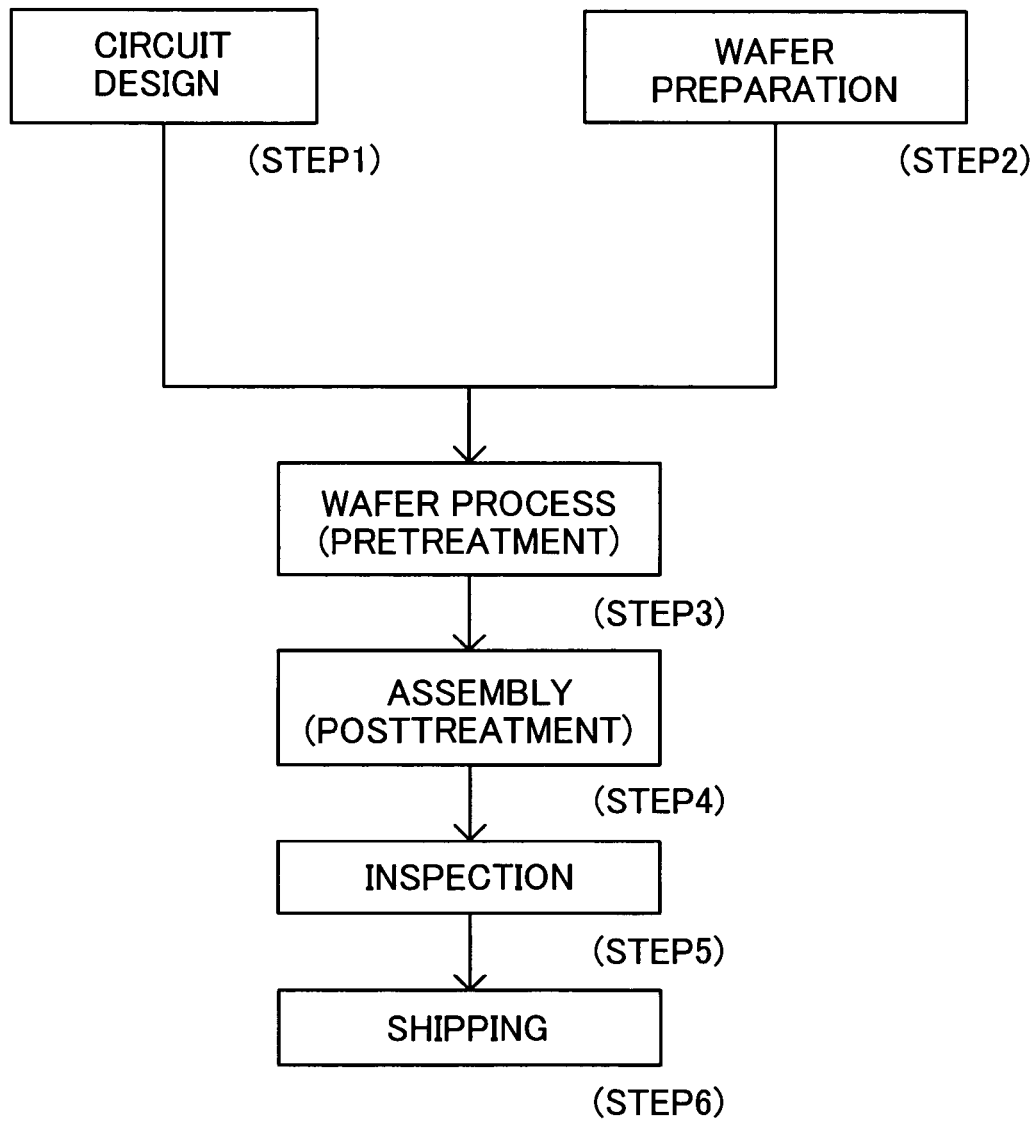
FIG. 11 is a flowchart for explaining manufacture of devices (such as semiconductor chips such as ICs and LCDs, CCDs, and the like).
Figure 12:
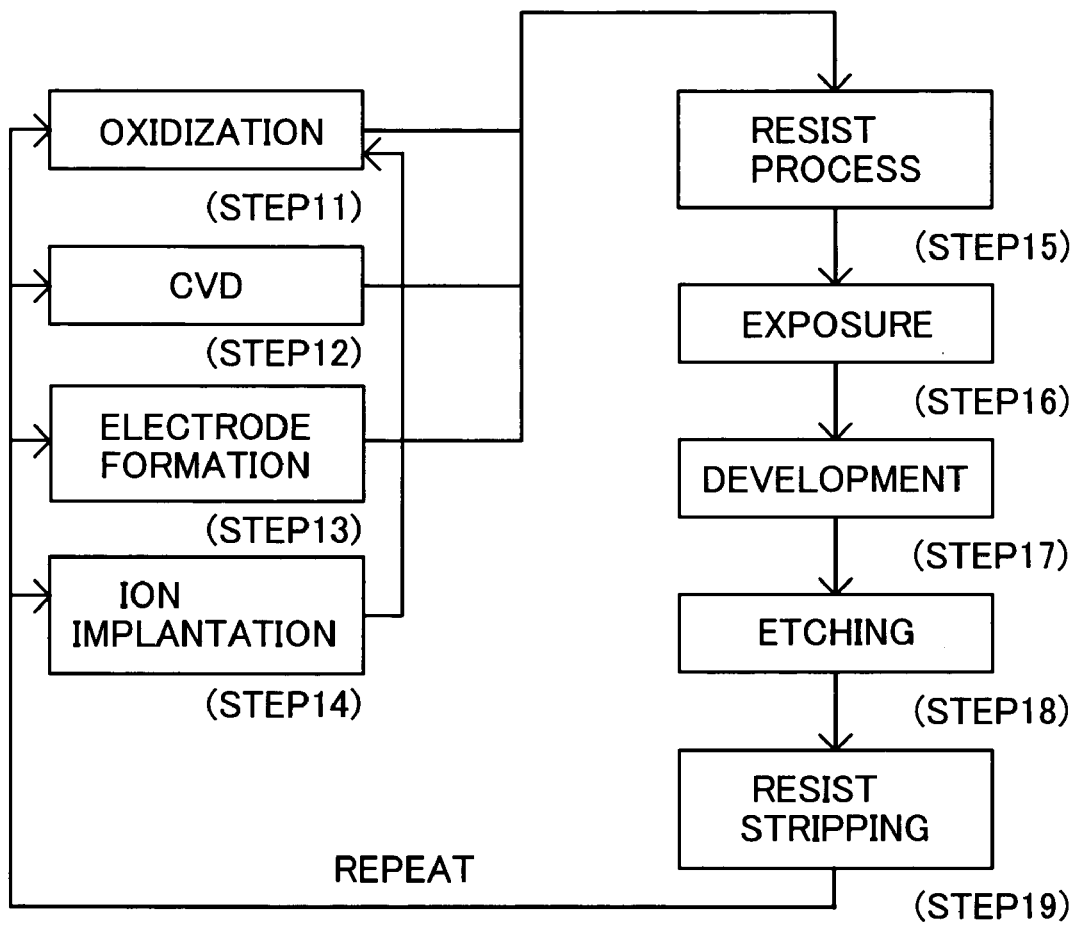
FIG. 12 is a detailed flowchart of a wafer process as Step 3 shown in FIG. 11.
Figure 13:
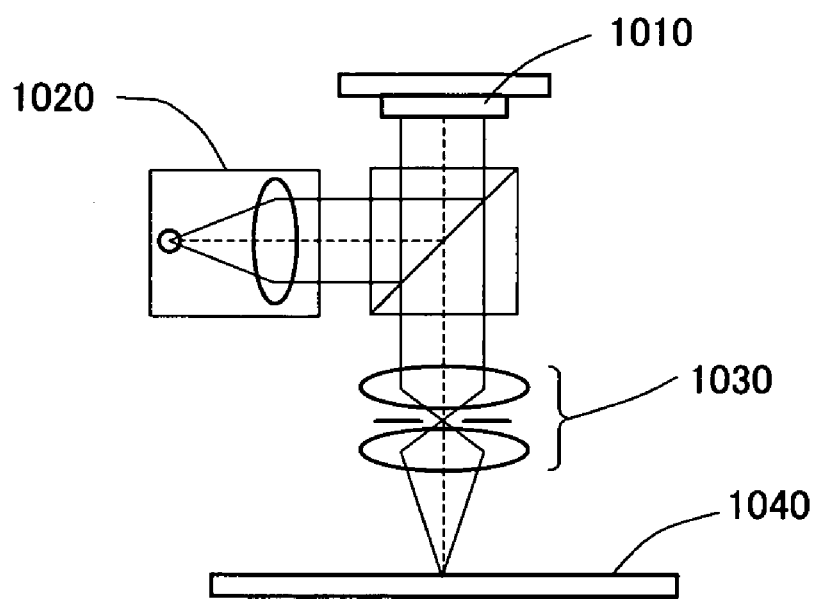
FIG. 13 is a schematic sectional view showing a conventional maskless exposure apparatus.

Referring now to FIGS. 11 and 12, a description will now be given of an embodiment of a device manufacturing method using the above exposure apparatus 100. FIG. 11 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (wafer preparation) manufactures a wafer using materials such as silicon. Step 3 (wafer process), which is referred to as a pretreatment, forms actual circuitry on the wafer through photolithography using the wafer. Step 4 (assembly), which is also referred to as a post-treatment, forms into a semiconductor chip the wafer formed in Step 3 and includes an assembly step (e.g., dicing, bonding), a packaging step (chip sealing), and the like. Step 5 (inspection) performs various tests for the semiconductor device made in Step 4, such as a validity test and a durability test. Through these steps, a semiconductor device is finished and shipped (Step 6).

FIG. 12 is a detailed flowchart of the wafer process in Step 3. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern (that is designed in step 1 and formed by the MMA) onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This embodiment can provide higher-quality semiconductor devices than the prior art. Thus, the device manufacturing method that uses the exposure apparatus 100, and its resultant products also constitute one aspect of the present invention.

Further, the present invention is not limited to these preferred embodiments, and various variations and modifications may be made without departing from the scope of the present invention. For example, while the above embodiments discuss the spatial modulation element as the MMA, the inventive spatial modulation element may be applied, for example, to a liquid crystal. Even when a pattern formed by the spatial modulation element is not a gray scale, the throughput increases when the wafer is scanned with the pattern.

This application claims a benefit of priority based on Japanese Patent Application No. 2004-311010, filed on Oct. 26, 2004, which is hereby incorporated by reference herein in its entirety as if fully set forth herein.

What is claimed is:

1. An exposure apparatus comprising:
    a projection optical system for projecting a multigradation pattern onto an object;
    a spatial modulation element that includes plural, two-dimensionally arranged pixels, and forms an optical image by binary control over each pixel; and
    a superposing optical system for forming the multigradation pattern by superposing the optical images for each row and/or for each column,
    wherein the spatial modulation element is a micro-mirror array, and the plural pixels have reflectances that differ by power for each row and/or for each column.

2. An exposure apparatus according to claim 1, wherein the binary control includes control over brightness and darkness of the pixel with line symmetry.

3. An exposure apparatus according to claim 1, wherein the plural pixels have such reflectances that the number of powers changes by one between two adjacent rows or columns.

4. An exposure apparatus according to claim 1, further comprising:
    a mirror for scanning the multigradation pattern on the object; and
    a wafer stage for scanning the object,
    wherein a scan direction of said mirror and a scan direction of the object form a right angle on the object.

5. A device manufacturing method comprising the steps of:
    exposing an object using an exposure apparatus according to claim 1; and
    developing the object that has been exposed.

6. An exposure apparatus comprising:
    a projection optical system for projecting a multigradation pattern onto an object;
    a spatial modulation element that includes plural, two-dimensionally arranged pixels, and forms an optical image by binary control over each pixel;
    a superposing optical system for forming the multigradation pattern by superposing the optical images for each row and/or for each column; and
    a filter having a transmittance that is different for each row and/or for each column of the plural pixels,
    wherein the spatial modulation element is a micro-mirror array, and the plural pixels have reflectances that differ by power for each row and/or for each column.

7. An exposure apparatus according to claim 6, wherein the filter has a transmittance that differs by power for each row and/or for each column.

8. An exposure apparatus according to claim 7, wherein the filter has such transmittance that the number of powers changes by one between two adjacent rows or columns.

9. An exposure apparatus according to claim 7, wherein said superposing optical system is a wedge prism array along a direction in which plural pixels are arranged in said spatial modulation element.

* * * * *